(12) United States Patent
Sakai

(10) Patent No.: US 8,564,134 B2
(45) Date of Patent: Oct. 22, 2013

(54) SEMICONDUCTOR SUBSTRATE, SEMICONDUCTOR DEVICE, AND MANUFACTURING METHODS THEREOF

(75) Inventor: Shiro Sakai, Tokushima (JP)

(73) Assignee: Seoul Opto Device Co., Ltd., Ansan-si (KR)

( * ) Notice: Subject to any disclaimer, the term of this patent is extended or adjusted under 35 U.S.C. 154(b) by 206 days.

(21) Appl. No.: 12/875,649

(22) Filed: Sep. 3, 2010

(65) Prior Publication Data

US 2011/0193236 A1 Aug. 11, 2011

(30) Foreign Application Priority Data

Feb. 10, 2010 (JP) ................................. 2010-028203

(51) Int. Cl.
*H01L 23/52* (2006.01)

(52) U.S. Cl.
USPC ............ 257/773; 257/E23.141; 257/E21.158; 257/E21.09; 257/189; 438/478

(58) Field of Classification Search
USPC ............. 257/773, E23.141, E21.158, E21.09, 257/189
See application file for complete search history.

(56) References Cited

U.S. PATENT DOCUMENTS

| | | | |
|---|---|---|---|
| 6,024,884 A | 2/2000 | Bryant et al. | |
| 6,294,475 B1 | 9/2001 | Schubert et al. | |
| 7,196,399 B2 | 3/2007 | Usui et al. | |
| 7,230,282 B2 | 6/2007 | Shibata | |
| 7,364,991 B2 | 4/2008 | Bour et al. | |
| 7,435,608 B2 | 10/2008 | Shibata | |
| 7,642,112 B2 | 1/2010 | Atoji et al. | |
| 8,026,119 B2 | 9/2011 | Kim et al. | |
| 8,053,811 B2 * | 11/2011 | Hiramatsu et al. | 257/190 |
| 8,198,179 B2 | 6/2012 | Sakai et al. | |
| 2001/0053618 A1 | 12/2001 | Kozaki et al. | |
| 2002/0197825 A1 * | 12/2002 | Usui et al. | 438/459 |
| 2003/0047746 A1 | 3/2003 | Kuniyasu et al. | |

(Continued)

FOREIGN PATENT DOCUMENTS

| | | |
|---|---|---|
| JP | 2004-0266624 | 1/2004 |
| JP | 2005-057220 | 3/2005 |

(Continued)

OTHER PUBLICATIONS

Notice of Allowance of U.S. Appl. No. 13/506,295 issued on Jul. 25, 2012.

(Continued)

*Primary Examiner* — S. V. Clark
*Assistant Examiner* — Krista Soderholm
(74) *Attorney, Agent, or Firm* — H.C. Park & Associates, PLC

(57) ABSTRACT

The present invention provides a method of manufacturing a gallium nitride (GaN) substrate on a heterogeneous substrate at low cost while realizing performance improvement and long operational lifespan of semiconductor devices, such as LEDs or laser diodes, which are manufactured using the GaN substrate. The semiconductor substrate includes a substrate, a first semiconductor layer arranged on the substrate, a mask arranged on a first region of the first semiconductor layer, a metallic material layer arranged on the first semiconductor layer and the mask, the metallic material layer being arranged in a direction intersecting the mask, a second semiconductor layer arranged on the first semiconductor layer and the metallic material layer, and a cavity in the first semiconductor layer and arranged under the metallic material layer.

20 Claims, 15 Drawing Sheets

(56) References Cited

U.S. PATENT DOCUMENTS

| | | |
|---|---|---|
| 2003/0143771 A1 | 7/2003 | Kidoguchi et al. |
| 2003/0183157 A1 | 10/2003 | Usui et al. |
| 2004/0021147 A1 | 2/2004 | Ishibashi et al. |
| 2004/0206967 A1 | 10/2004 | Oshima et al. |
| 2004/0209442 A1 | 10/2004 | Takakuwa et al. |
| 2005/0077512 A1 | 4/2005 | Yoon et al. |
| 2005/0194564 A1 | 9/2005 | Fujita et al. |
| 2006/0006408 A1 | 1/2006 | Suehiro et al. |
| 2006/0046511 A1 | 3/2006 | Shibata et al. |
| 2006/0151797 A1 | 7/2006 | Park |
| 2006/0151801 A1 | 7/2006 | Doan et al. |
| 2007/0243702 A1 | 10/2007 | Nijhawan et al. |
| 2008/0014723 A1 | 1/2008 | Shibata |
| 2008/0251803 A1 | 10/2008 | Cho et al. |
| 2008/0296586 A1 | 12/2008 | Francis et al. |
| 2009/0093122 A1 | 4/2009 | Ueda et al. |
| 2009/0098677 A1 | 4/2009 | Shibata |
| 2009/0130853 A1 | 5/2009 | Chou et al. |
| 2009/0280625 A1 | 11/2009 | Lin et al. |
| 2010/0015739 A1 | 1/2010 | Park |
| 2010/0139758 A1 | 6/2010 | Chang et al. |
| 2010/0219436 A1 | 9/2010 | Watanabe |
| 2010/0252859 A1 | 10/2010 | Son |
| 2010/0314661 A1 | 12/2010 | Sakai |
| 2010/0320506 A1 | 12/2010 | Varangis et al. |
| 2011/0053303 A1 | 3/2011 | Kim et al. |

FOREIGN PATENT DOCUMENTS

| | | |
|---|---|---|
| JP | 2005-064247 | 3/2005 |
| JP | 2005-085851 | 3/2005 |
| KR | 10-2002-0010583 | 2/2002 |
| KR | 10-2003-0030019 | 4/2003 |
| KR | 10-2003-0032965 | 4/2003 |
| KR | 10-2005-0035565 | 4/2005 |
| KR | 10-2006-0081107 | 7/2006 |
| KR | 10-2006-0135568 | 12/2006 |
| KR | 10-2007-0009854 | 1/2007 |
| KR | 1020070005984 | 1/2007 |
| KR | 10-2007-0101424 | 10/2007 |
| KR | 10-2008-0093222 | 10/2008 |
| KR | 10-2008-0100466 | 11/2008 |
| WO | 03/098710 | 11/2003 |

OTHER PUBLICATIONS

Non-Final Office Action of U.S. Appl. No. 12/801,455 issued Aug. 29, 2012.
Non-Final Office Action of U.S. Appl. No. 12/929,712 issued Dec. 2, 2011.
International Search Report issued on Sep. 28, 2011, corresponding to International Application No. PCT/KR2011/000871.
Notice of Allowance dated May 27, 2011, issued for related co-pending U.S. Appl. No. 12/805,958.
Notice of Allowance of U.S. Appl. No. 12/805,958 issued on Feb. 25, 2011.
PCT Search Report of PCT/KR2010/004816 dated Feb. 24, 2011, corresponding to U.S. Appl. No. 12/509,958.
International Search Report of PCT/KR2010/003724 issued on Jan. 14, 2011, corresponding to U.S. Appl. No. 12/801,455.
Written Opinion of PCT/KR2010/003724 issued on Jan. 14, 2011, corresponding to U.S. Appl. No. 12/801,455.
Non-Final Office Action of U.S. Appl. No. 13/137,124 issued Nov. 25, 2011.
Non-Final Office Action of U.S. Appl. No. 12/650,276 issued Nov. 10, 2011.
Final Office Action of U.S. Appl. No. 12/650,276 dated Apr. 12, 2012.
Final Office Action of U.S. Appl. No. 12/929,712 dated Apr. 5, 2012.
Notice of Allowance issued for related U.S. Appl. No. 13/137,124 dated Feb. 6, 2012.
S. Hasegawa, et al., "Polycrystalline GaN for light emitter and field electron emitter applications", Thin Solid Films 487 (2005), pp. 260-267.
M. Haino, et al. "Buried Tungsten Metal Structure Fabricated by Epitaxial-Lateral-Overgrown GaN via Low-Pressure Metalorganic Vapor Phase Epitaxy" Japan Journal of Applied Physics, 39 (2000) pp. 449-452.
Notice of Allowance issued for related U.S. Appl. No. 12/650,276 dated Jun. 25, 2012.
Final Office Action of U.S. Appl. No. 12/801,455 dated Nov. 23, 2012.
Non-Final Office Action of U.S. Appl. No. 12/929,712 dated Nov. 28, 2012.
Notice of Allowance dated Mar. 5, 2013 issued to related U.S. Appl. No. 12/929,712.
Non-Final Office Action issued to U.S. Appl. 13/694,058 dated May 22, 2013.
Non-Final Office Action issued to U.S. Appl. No. 13/507,210 dated Apr. 30, 2013.
Notice of Allowance issued on Sep. 4, 2013 in U.S. Appl. No. 13/694,058.

* cited by examiner

Fig. 4
(A) SEM micrograph of enlarged region
(B) EDX diagram of Ga
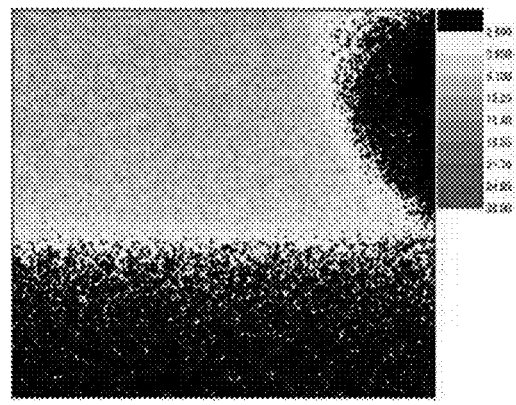
(C) EDX diagram of Al
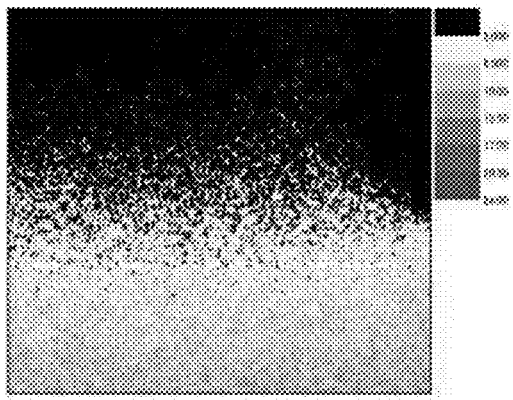
(D) EDX diagram of O
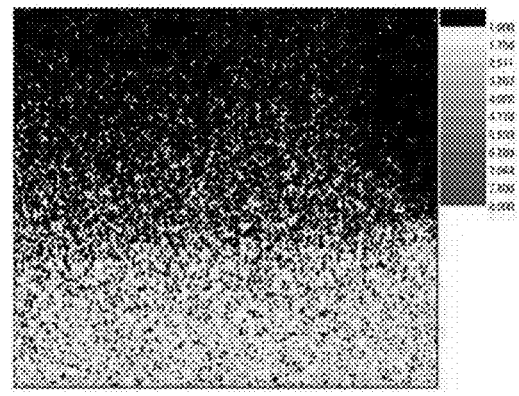

Fig. 5
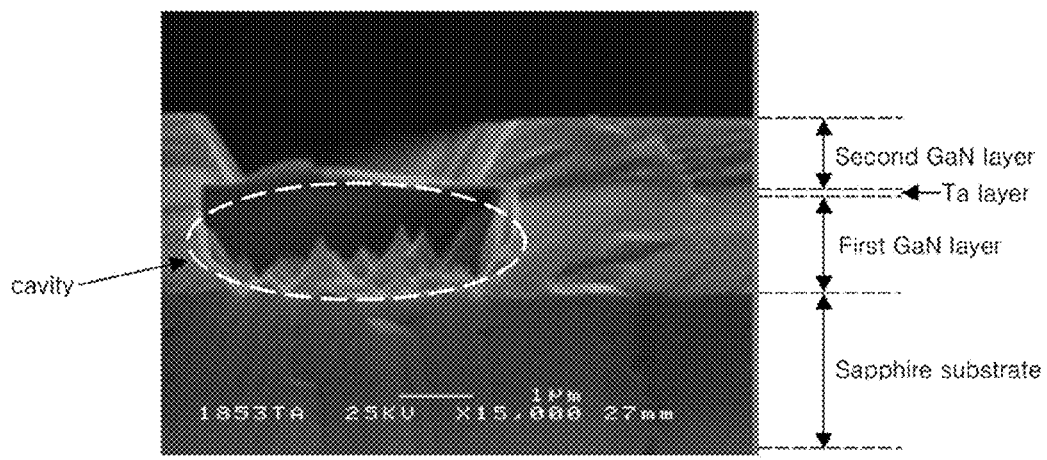
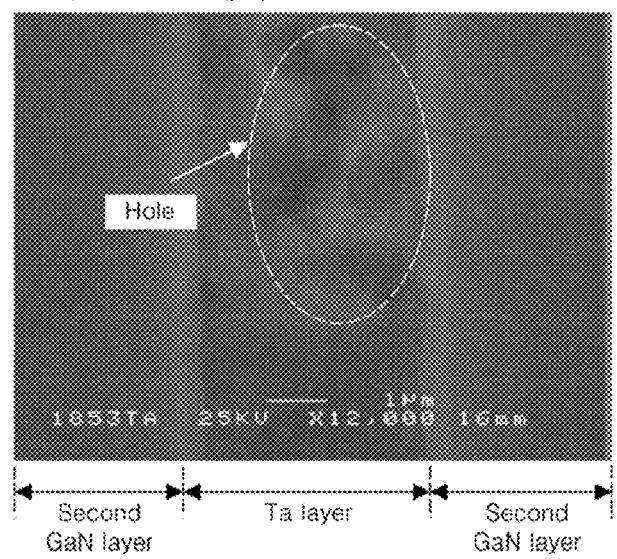

Fig. 6
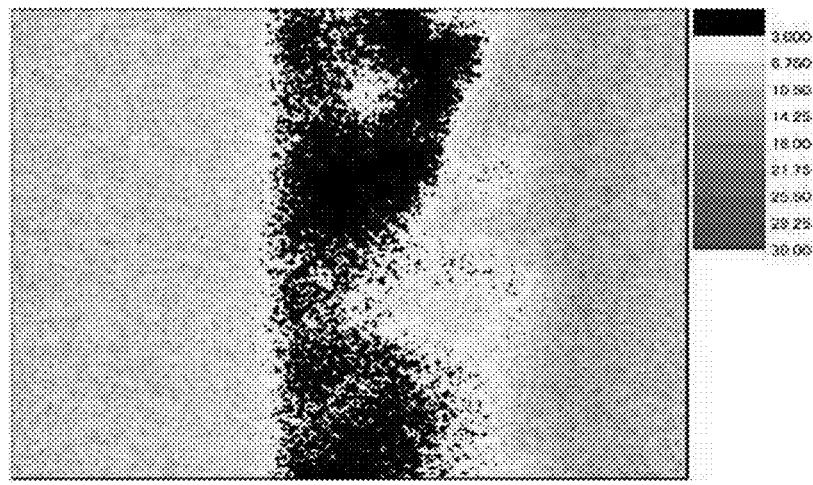
(A) EDX diagram of Ga
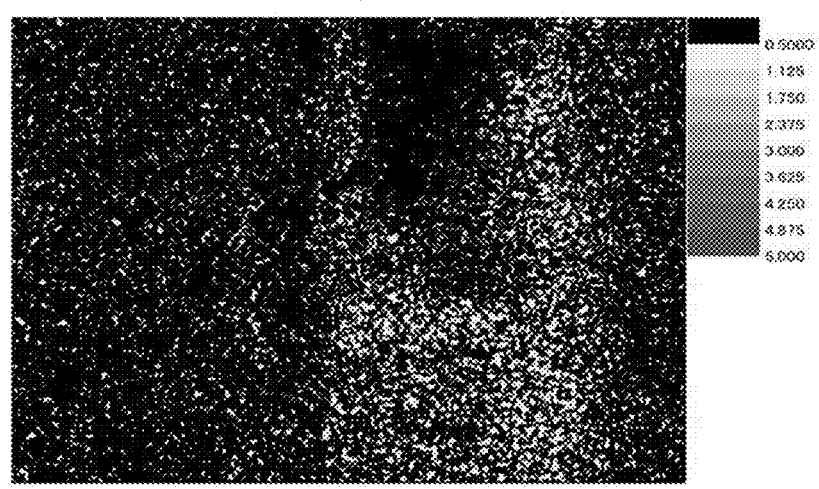
(B) EDX diagram of Ta

Fig. 8
(A) Example of GaN layer having 5 nm thick Ta layer thereon
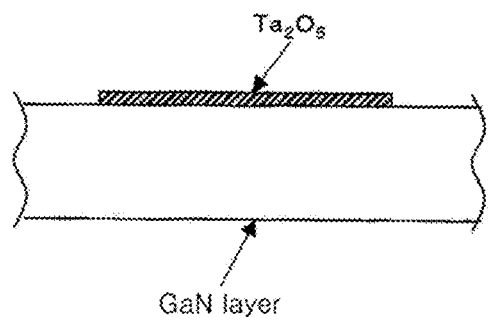
(B) Example of GaN layer having 100 nm thick Ta layer thereon
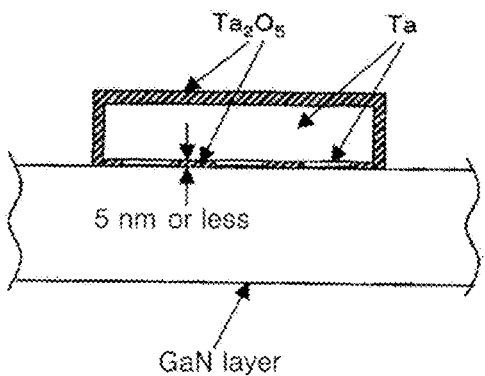

Optical micrograph of GaN surface

SEM micrograph of side section of GaN

SEMICONDUCTOR SUBSTRATE, SEMICONDUCTOR DEVICE, AND MANUFACTURING METHODS THEREOF

CROSS-REFERENCE TO RELATED APPLICATIONS

This application claims priority from and the benefit of Japanese Patent Application No. 2010-028203, filed on Feb. 10, 2010, which is hereby incorporated by reference for all purposes as if fully set forth herein.

BACKGROUND OF THE INVENTION

1. Field of the Invention

The present disclosure relates to semiconductor substrates, semiconductor devices, and manufacturing methods thereof. More particularly, the present disclosure relates to a semiconductor substrate having a GaN layer formed on a substrate, a semiconductor device, and manufacturing methods thereof.

2. Discussion of the Background

A light emitting diode (LED) that has a gallium nitride (GaN) based semiconductor may be used for various applications, such as signal devices, backlight units for liquid crystal panels, and the like. It is known that light emitting efficiency of LEDs is affected by dislocation density and defects in a crystal. Although GaN-based semiconductor crystals may be grown on a heterogeneous substrate, such as sapphire or the like, lattice mismatch and differences in thermal expansion between the GaN layer and the substrate may occur, causing a high dislocation density or an increase in defect density.

The crystal growth of a GaN-based semiconductor may be carried out on a homogeneous substrate, such as a GaN substrate and the like. However, a high dissociation rate of nitrogen in GaN may obstruct formation of a GaN melt, thereby making it difficult to form a GaN substrate. Although mechanical polishing, laser delamination or the like may be used to separate the GaN substrate from a GaN bulk crystal grown for the GaN substrate, it may be difficult to produce a GaN substrate having a practical size. Particularly, the laser delamination may require a significantly long period of time to perform and cause an increase in the cost of the GaN substrate.

GaN crystal growth is shown and described in "Polycrystalline GaN for light emitter and field electron emitter applications," by S. Hasegawa, S. Nishida, T. Yamashita, H. Asahi, (Thin Solid Films 487 (2005), pp 260-267) (hereinafter "Hasegawa, et al."), and "Buried Tungsten Metal Structure Fabricated by Epitaxial-Lateral-Overgrown GaN via Low-Pressure Metalorganic Vapor Phase Epitaxy," M. Haino, et al., (Jpn. J. Appl. Phys., 39 (2000) L449) (hereinafter "Haino, et. al."), which are hereby incorporated by reference in their entirety for all purposes as if fully set forth herein. For example, GaN crystals are respectively grown on quartz substrates, high-melting-point metal substrates of Tungsten (W), Molybdenum (Mo), Tantalum (Ta), and Niobium (Nb), and Silicon (Si) substrates using plasma assisted molecular beam epitaxy.

Since it may be difficult and costly to fabricate the GaN substrate, semiconductor devices such as LEDs or laser diodes are generally manufactured by growing a GaN layer on a heterogeneous substrate, such as sapphire and the like. However, as mentioned above, the high dislocation density or the increase in defect density may degrade the light emitting efficiency of the LED. In addition, the sapphire substrate has a lower thermal conductivity than the GaN substrate, and may cause deterioration in heat dissipation properties of a device. Thus, the use of a sapphire substrate for LEDs or laser diodes may limit the operational lifespan thereof.

SUMMARY OF THE INVENTION

The present invention provides a method of manufacturing a flat and easily separable GaN substrate on a heterogeneous substrate at low cost.

The present invention also provides a semiconductor device manufactured using the GaN substrate which may have improved performance or operational lifespan.

Additional features of the invention will be set forth in the description which follows, and in part will be apparent from the description, or may be learned by practice of the invention.

The present invention discloses a semiconductor substrate including a substrate, a first semiconductor layer arranged on the substrate, a mask arranged on a first region of the first semiconductor layer, a metallic material layer arranged on the first semiconductor layer and the mask, the metallic material layer being arranged in a direction intersecting the mask, a second semiconductor layer arranged on the first semiconductor layer and the metallic material layer, and a cavity in the first semiconductor layer and arranged under the metallic material layer.

The present invention also discloses a method of manufacturing a semiconductor substrate, the method including forming a first semiconductor layer on a substrate, forming a mask on a first region of the first semiconductor layer, forming a metallic material layer on the first semiconductor layer and the mask, the metallic material layer being formed in a direction intersecting the mask, and forming a second semiconductor layer on the first semiconductor layer and the metallic material layer, wherein a cavity is formed in the first semiconductor layer and arranged under the metallic material layer.

The present invention also discloses a semiconductor device including a semiconductor substrate including a substrate, a first semiconductor layer arranged on the substrate, a mask arranged on a first region of the first semiconductor layer, a metallic material layer arranged on the first semiconductor layer and the mask, the metallic material layer being arranged in a direction intersecting the mask, a second semiconductor layer arranged on the first semiconductor layer and the metallic material layer, and a cavity in the first semiconductor layer and arranged under the metallic material layer, a first conductive type semiconductor layer arranged on the second semiconductor layer, an active layer arranged on the first conductive type semiconductor layer, and a second conductive type semiconductor layer arranged on the active layer.

The present invention also discloses a method of manufacturing a semiconductor device, the method including forming a semiconductor substrate including forming a first semiconductor layer on a substrate, forming a mask on a first region of the first semiconductor layer, forming a metallic material layer on the first semiconductor layer and the mask, the metallic material layer being formed in a direction intersecting the mask, and forming a second semiconductor layer on the first semiconductor layer and the metallic material layer, wherein a cavity is formed in the first semiconductor layer and arranged under the metallic material layer, forming a first conductive type semiconductor layer on the second semiconductor layer, forming an active layer on the first conductive type semiconductor layer, and forming a second conductive type semiconductor layer on the active layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 4 is a SEM micrograph and EDX diagrams of the semiconductor substrate of FIG. 2, in which (A) is a SEM micrograph of an enlarged region shown in FIG. 2, (B) is an EDX diagram of Ga, (C) is an EDX diagram of Al, and (D) is an EDX diagram of O.

FIG. 5 is SEM micrographs of the semiconductor substrate of FIG. 2, in which (A) is a SEM micrograph of a side section of the semiconductor substrate and (B) is a SEM micrograph of a surface of the semiconductor substrate.

FIG. 6 is EDX diagrams of the semiconductor substrate of FIG. 5, in which (A) is an EDX diagram of Ga and (B) is an EDX diagram of Ta.

FIG. 8(A) is a diagram showing a $Ta_2O_5$ film converted from a 5 nm thick Ta layer, and FIG. 8(B) is a diagram showing a $Ta_2O_5$ film on a surface of a 100 nm thick Ta layer.

DETAILED DESCRIPTION OF THE ILLUSTRATED EMBODIMENTS

Figure 1:
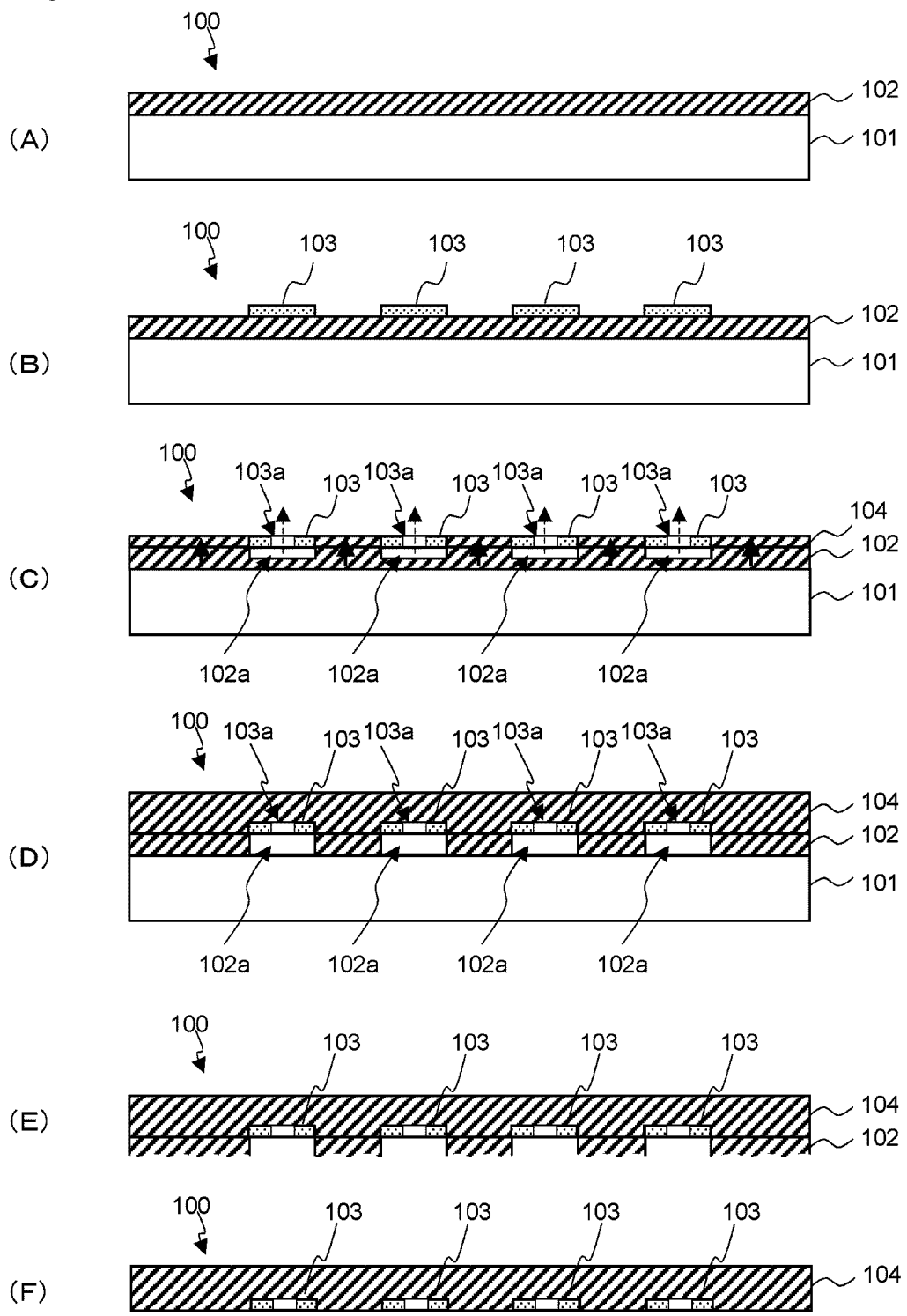
FIG. 1 is a flow diagram of a method of manufacturing a semiconductor substrate in accordance with an exemplary embodiment of the present invention, in which (A) is a sectional view of a process of forming a first GaN layer, (B) is a sectional view of a process of forming a Ta layer, (C) is a sectional view of a process of forming a second GaN layer and a cavity, (D) is a sectional view of the semiconductor substrate after forming the second GaN layer, (E) is a sectional view of a process of separating a sapphire substrate from the semiconductor substrate, and (F) is a sectional view of a finished GaN substrate.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

A method of manufacturing a semiconductor substrate according to an exemplary embodiment of the present invention will be described with reference to FIG. 1. In FIG. 1, (A) is a sectional view of a process of forming a first GaN layer, (B) is a sectional view of a process of forming a Ta layer, (C) is a sectional view of a process of forming a second GaN layer and a cavity, (D) is a sectional view of the semiconductor substrate after forming the second GaN layer, (E) is a sectional view of a process of separating a sapphire substrate from the semiconductor substrate, and (F) is a sectional view of a finished GaN substrate.

Referring to FIG. 1(A), reference numeral 101 indicates a sapphire ($Al_2O_3$) substrate. First, a first GaN layer 102 having a thickness of about 2 μm is formed on the sapphire substrate 101. This thickness of the first GaN layer 102 is provided as an example.

Next, referring to FIG. 1(B), a Ta layer (metallic material layer) 103 having a thickness of about 50 nm is formed in a shape of stripes, which have a width of 5 μm and are separated a distance of 5 μm from each other, on the first GaN layer 102 by electron beam (EB) deposition and lift-off. The shape, thickness, width, and distance of the Ta layer 103 are provided as an example.

Referring to FIG. 1(C), a second GaN layer 104 is formed on the first GaN layer 102 and the Ta layer 103 by metal organic chemical vapor deposition (MOCVD). The first GaN layer 102 and the second GaN layer 104 may include different semiconductor material such as AlGaN, InGaN, or AlInGaN. FIG. 1(C) shows the second GaN layer 104 during formation thereof. In the present exemplary embodiment, N in the GaN layer combine with Ta to form TaN, which acts as foreign matter and rises towards a vapor having a higher density of N. The TaN becomes unstable at 900° C. or more, and a hole 103a is deepened to form a cavity 102a depending on the degree of instability. Here, although N in the first GaN layer 102 becomes TaN, Ga remains in the first GaN layer 102. Since this Ga remaining in the first GaN layer 102 is the same as Ga deposited during the vapor deposition, it is used as the raw material. However, GaN may also be grown on a Ta film. As disclosed in Hasegawa, et al., there is a possibility that the surface of the Ta layer 103 becomes not only Ta, but also $Ta_2O_5$ by treatment with air.

Next, referring to FIG. 1(D), once the formation of the second GaN layer 104 is completed, the semiconductor substrate is formed. While the second GaN layer 104 is formed by MOCVD, a portion of the first GaN layer 102 under the Ta layer 103 is removed by etching and a formation region of the cavity 102a is extended substantially to the sapphire substrate 101. Further, since the growth of the first GaN layer 102 progresses along with the growth of the second GaN layer 104, the surface of the substrate may be flattened as shown in FIG. 1(D).

Next, referring to FIG. 1(E), the sapphire substrate 101 is separated from the first GaN layer 102. Then, referring to FIG. 1(F), the GaN substrate may be obtained by polishing the first GaN layer 102, from which the sapphire substrate is removed. The GaN substrate may be used as a semiconductor substrate for manufacturing a device by attaching a silicon based substrate such as Si or SiC to an upper side of the GaN substrate and flattening a lower surface thereof. Furthermore, the cavity 102a formed in the first GaN layer 102 may be used to separate the sapphire substrate 101. Separation of the sapphire substrate 101 may also be performed by, for example, a laser lift-off or polishing process. The sapphire substrate 101 may be separated from the first GaN layer 102 using any suitable method.

As such, when the semiconductor substrate 100 including the GaN layer is formed by MOCVD, the first GaN layer 102 can be easily separated from the sapphire substrate 101 using the cavity 102a, so that the separated GaN layer can be used as the GaN substrate. Accordingly, the GaN substrate may be manufactured at lower costs than the conventional GaN substrate.

Next, an example of the process of forming the second GaN layer 104 using an MOCVD apparatus will be described with reference to FIGS. 2 to 6. In this example, crystals were grown at a heating temperature of 1045° C. for 5 hours while tri-methyl gallium (TMG) was supplied as a raw gas at a flux of 20 μmol/min. Further, in this example, a Ta layer 103 having a thickness of 50 nm was formed in a shape of stripes on the first GaN layer 102.

Figure 2:
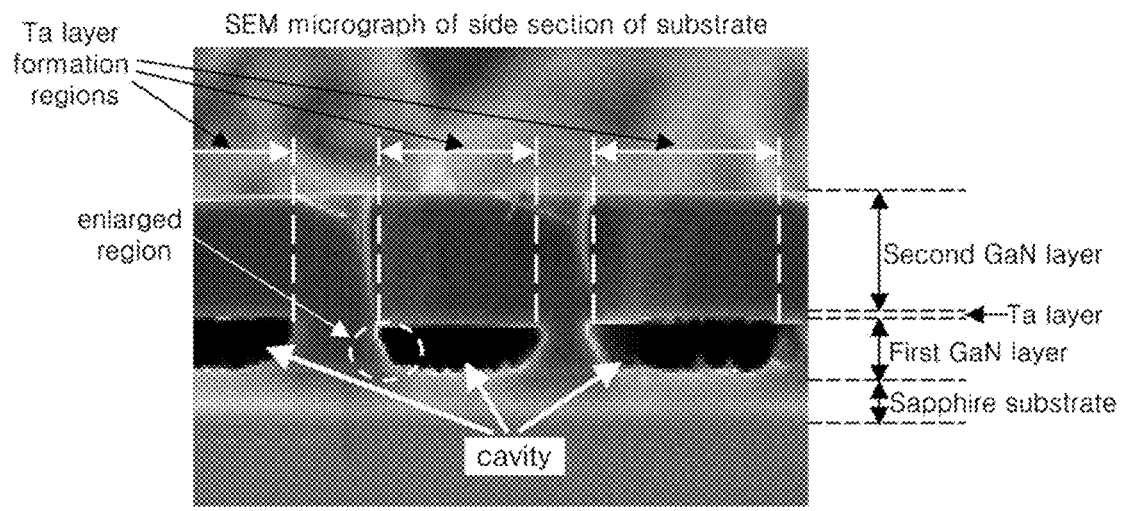
FIG. 2 is a scanning electron microscope (SEM) micrograph of a semiconductor substrate manufactured by the method of FIG. 1.

In FIG. 2, the semiconductor substrate 100 with the second GaN layer 104 formed thereon under these conditions is shown. FIG. 2 is a SEM micrograph of a side section of a portion of the semiconductor substrate 100. As shown in FIG. 2, the cavity 102a is formed at a portion of the first GaN layer 102 under the Ta layer 103. An enlarged region including the cavity 102a in FIG. 2 was analyzed using an energy dispersion x-ray spectrometer (EDX), and the analysis result is shown in FIG. 3.

Figure 3:
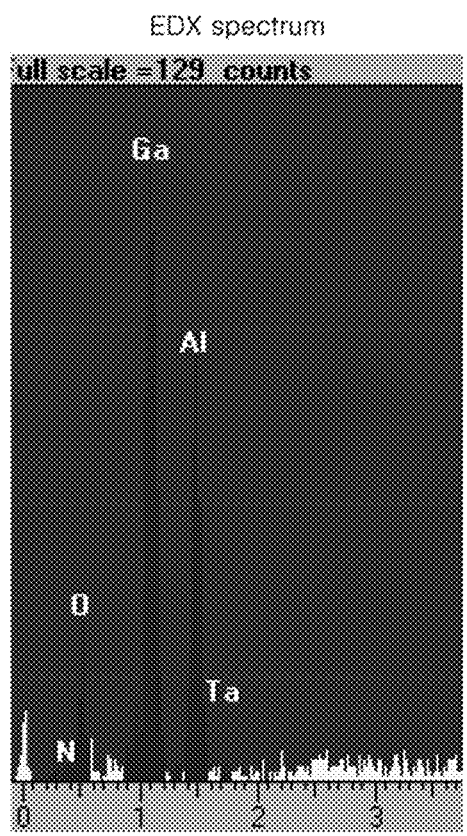
FIG. 3 is an energy dispersive x-ray spectrometer (EDX) spectrum of the semiconductor substrate of FIG. 2.

In the EDX spectrum of FIG. 3, GaN of the first GaN layer 102, and Al and O of the sapphire substrate 101 are observed, but Ta is not substantially observed. Further, in EDX diagrams of FIG. 4(B), FIG. 4(C), and FIG. 4(D), Ga of the first GaN layer 102, and Al and O of the sapphire substrate 101 are observed, but Ta is not observed.

In this example, it was observed that holes 103a were formed in the Ta layer 103 during the formation of the second GaN layer 104. Analysis results of the holes 103a formed in the Ta layer 103 are shown in FIG. 5 and FIG. 6, and will be described in detail hereinafter. Here, the analysis results shown in FIG. 5 and FIG. 6 were obtained using the EDX by stopping the process of forming the second GaN layer 104 using the MOCVD apparatus.

FIG. 5 shows SEM micrographs of the semiconductor substrate 100, in which (A) is a SEM micrograph of a side section of the semiconductor substrate 100 and (B) is a SEM micrograph of a surface of the semiconductor substrate 100. FIG. 6 shows EDX diagrams of the surface of the semiconductor substrate 100 of FIG. 5(B), in which (A) is an EDX diagram of Ga and (B) is an EDX diagram of Ta.

In the SEM micrograph of the semiconductor substrate 100 of FIG. 5(A), it is observed that a portion of the first GaN layer 102 under the Ta layer 103 is etched and the cavity 102a is formed therein. In the SEM micrograph of the surface of the semiconductor substrate 100 of FIG. 5(B), it is observed that holes 103a were formed on the surface of the Ta layer 103. EDX analysis results for Ga and Ta on the surface of the Ta layer 103 including the holes 103a are shown in FIG. 6(A) and FIG. 6(B). As shown in the EDX diagrams, the Ta layer 103 remains and Ga and GaN are thinly grown on the remaining Ta layer 103.

A process of forming the second GaN layer 104 under different conditions of the MOCVD apparatus according to another exemplary embodiment of the present invention will be described. In the present exemplary embodiment, crystals were grown at a heating temperature of 1045° C. for 5 hours while TMG was supplied as a raw gas at a flux of 87 μmol/min.

In this example, a first GaN layer 102 having a thickness of about 2 μm was formed on a sapphire substrate 101, and a Ta layer (metallic material layer) 103 having a thickness of about 5 nm was then formed in a shape of stripes, which have a pitch of 10 μm and are separated a distance of 5 μm from each other, on the first GaN layer 102 by EB deposition and lift-off. When the Ta layer 103 was formed in the shape of stripes, an axis of the stripes was in a direction [1 $\bar{1}$ 0 0] of the first GaN layer 102

Figure 7:
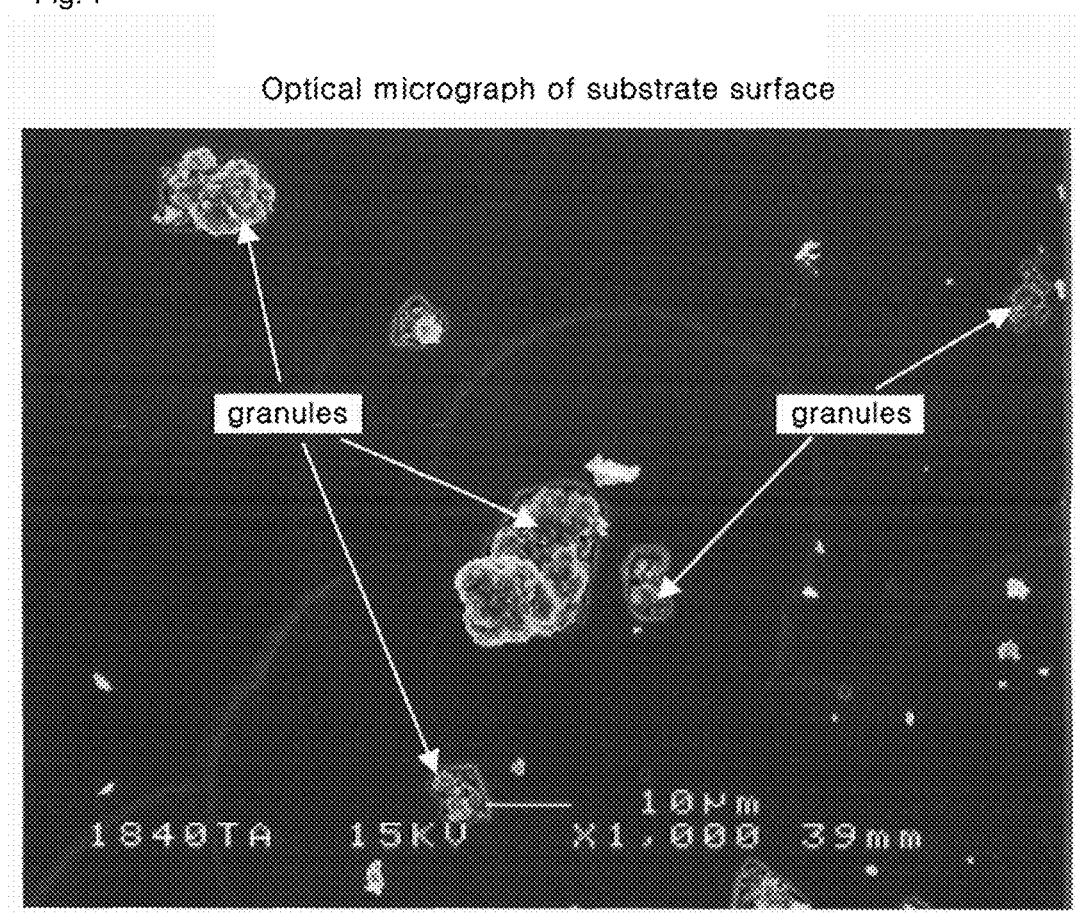
FIG. 7 is an optical micrograph of a surface of the semiconductor substrate.

FIG. 7 shows an optical micrograph of a surface of the semiconductor substrate 100 with the second GaN layer 104 formed thereon under these conditions. As indicated by arrows in FIG. 7, granular materials are precipitated on the surface of the second GaN layer 104. The EDX analysis shows that the granular materials are mixtures of Ga and Ta. That is, it is ascertained that granular mixtures of Ga and Ta are precipitated at an etched portion of the first GaN layer 102. Since such granular materials may be formed inside the second GaN layer 104, the surface of the second GaN layer 104 becomes uneven when the granular materials are removed, so that the semiconductor substrate cannot be used as a GaN substrate.

Next, formation of $Ta_2O_5$ on the Ta layer will be described. FIG. 8 shows that a $Ta_2O_5$ region in the Ta layer 103 varies depending on the thickness of the Ta layer 103. FIG. 8(A) is a diagram showing a $Ta_2O_5$ film converted from a 5 nm thick Ta layer 103, and FIG. 8(B) is a diagram showing a $Ta_2O_5$ film converted from a surface of a 100 nm thick Ta layer 103. After depositing the Ta layer 103 on the surface of the first GaN layer 102 using an EB deposition apparatus, the semiconductor substrate 100 with the Ta layer 103 was transferred to an MOCVD apparatus while the Ta layer 103 was exposed to air. The Ta layer 103 was converted into $Ta_2O_5$ by reaction with oxygen during the exposure of the Ta layer 103. As a result, when the Ta layer 103 was deposited to a thickness of 5 nm as shown in FIG. 8(A), the overall Ta layer 103 was converted into $Ta_2O_5$, and when the Ta layer 103 was deposited to a thickness of 100 nm as shown in FIG. 8(B), the surface of the Ta layer 103 was converted into $Ta_2O_5$. In other words, when Ta contacts air at room temperature, $Ta_2O_5$ is formed.

When the second GaN layer 104 is grown by placing the semiconductor substrate 100 having $Ta_2O_5$ on the surface of the Ta layer 103 in the MOCVD apparatus, TaN is formed at a portion where the Ta layer 103 contacts the first GaN layer 102. However, since the heating temperature is a temperature of 1000° C. or more, the TaN decomposes again into Ta and N. In this process, when the Ta layer 103 and the first GaN layer 102 are completely covered by the second GaN layer 104, Ta remaining under the second GaN layer 104 forms TaN, which in turn decomposes into Ta and N. Then, during the formation of TaN, Ga of the first GaN layer 102 remains. Since a top of the first GaN layer 102 is covered by the second GaN layer 104, there is no place to which the remaining Ga may move, so that Ga granules are precipitated on the surface of the second GaN layer 104 through the second GaN layer 104. Regardless of the thickness of the second GaN layer 104, this phenomenon occurs as long as the Ta layer 103 and the first GaN layer 102 remain under the second GaN layer 104. It may be difficult to avoid the precipitation of granular materials when the semiconductor substrate 100 is configured as shown in FIG. 1. This phenomenon may be avoided by removal of the first GaN layer 102, but the semiconductor substrate 100 may not be usable as the GaN substrate if the first GaN layer 102 is removed. Accordingly, in the semiconductor substrate 100 forming the GaN substrate shown in FIG. 1, it is desirable for the precipitation of granular materials on the surface of the second GaN layer 104 to be suppressed to allow the semiconductor substrate 100 to be used as the GaN substrate. In the following description, methods of manufacturing a semiconductor substrate 100 according to various exemplary embodiments will be described, in which the precipitation of granular materials is suppressed on the surface of the semiconductor substrate 100.

Figure 9:
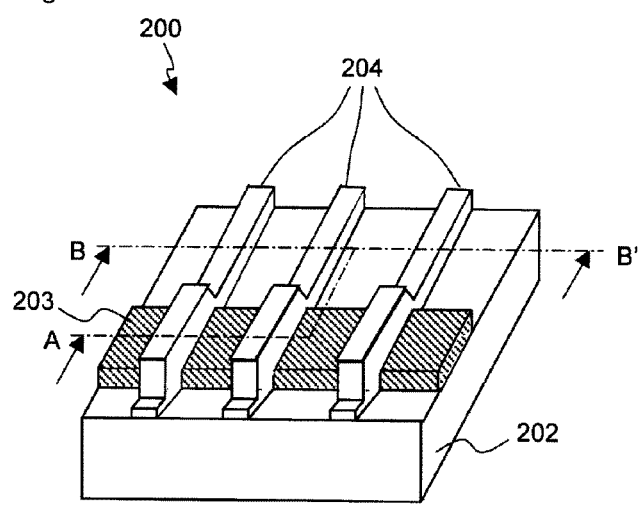
FIG. 9 is a perspective view of a semiconductor substrate in accordance with a first exemplary embodiment, showing main components of the semiconductor substrate.
Figure 10:
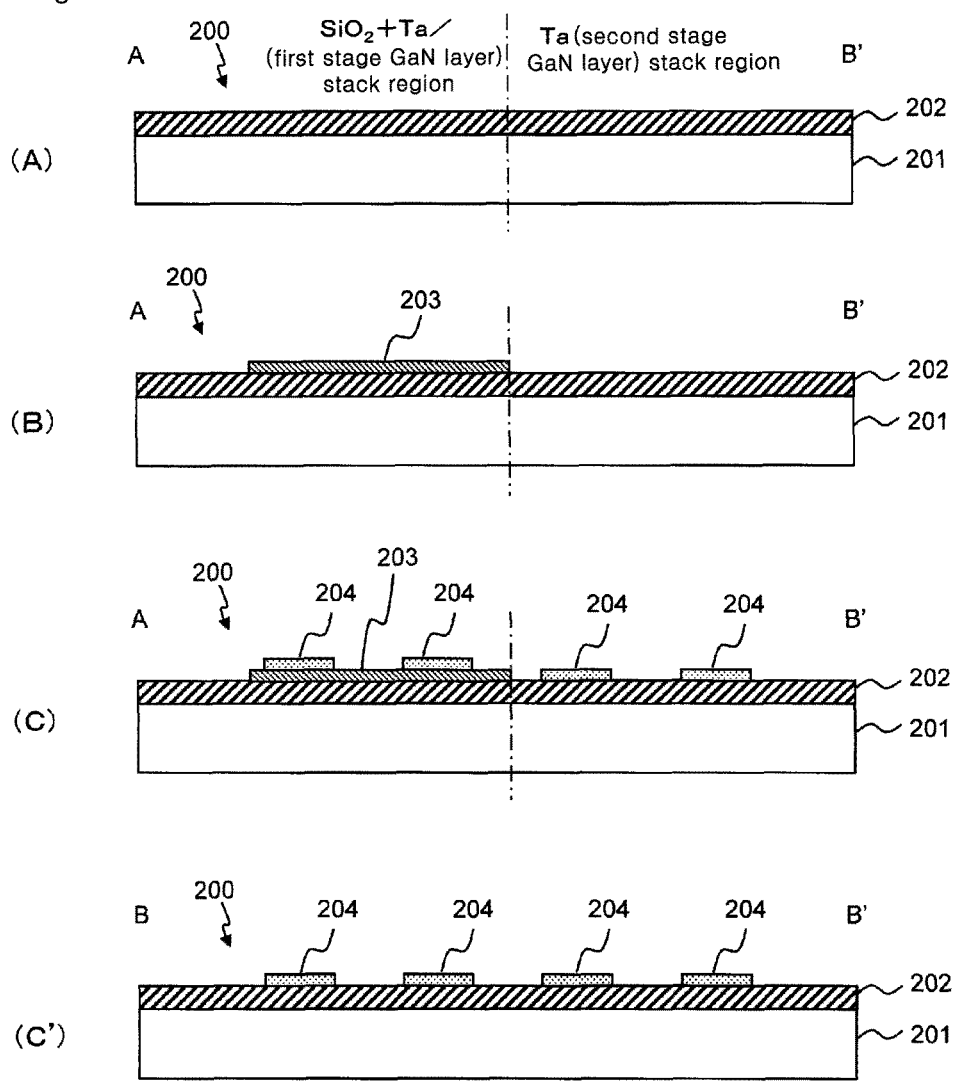
FIG. 10 a flow diagram of a method of manufacturing the semiconductor substrate in accordance with the first exemplary embodiment, in which (A) is a sectional view of a process of forming a first GaN layer, (B) is a sectional view of a process of forming a $SiO_2$ layer, (C) is a sectional view of a process of forming a Ta layer, and (C') is another sectional view of the process of forming the Ta layer.
Figure 11:
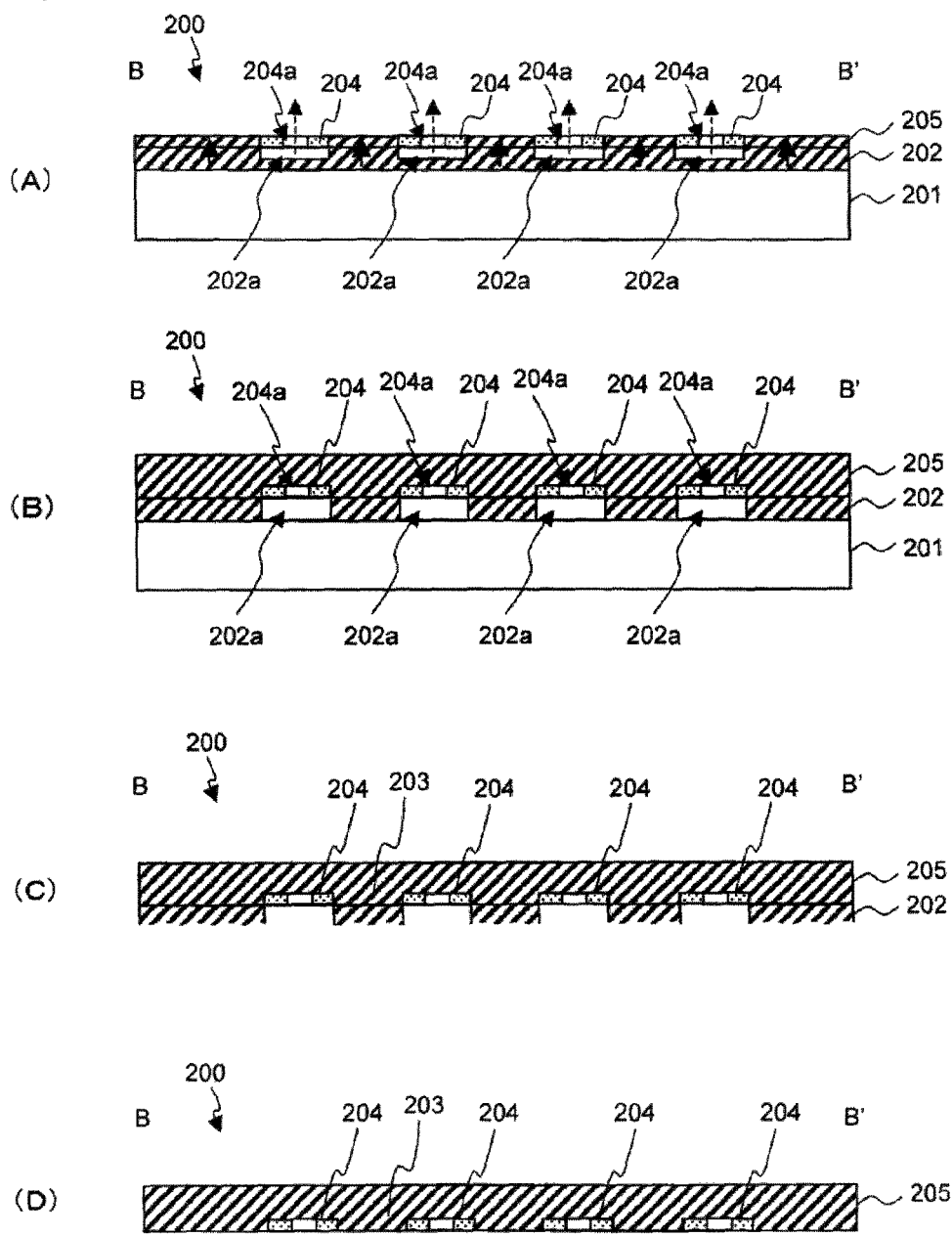
FIG. 11 is a flow diagram of the method of manufacturing a semiconductor substrate continuing from FIG. 10(C'), in which (A) is a sectional view of a process of forming a second GaN layer and a cavity, (B) is a sectional view of the semiconductor substrate after forming the second GaN layer, (C) is a sectional view of a process of separating a sapphire substrate from the semiconductor substrate, and (D) is a sectional view of a finished GaN substrate.

A method of manufacturing a semiconductor substrate according to an exemplary embodiment will be described with reference to FIGS. 9 to 14. FIG. 9 is a perspective view showing main components of a semiconductor substrate 200 according to the exemplary embodiment. FIGS. 10 and 11 are sectional views showing a method of manufacturing the semiconductor substrate 200 according to the exemplary embodiment.

Figure 12:
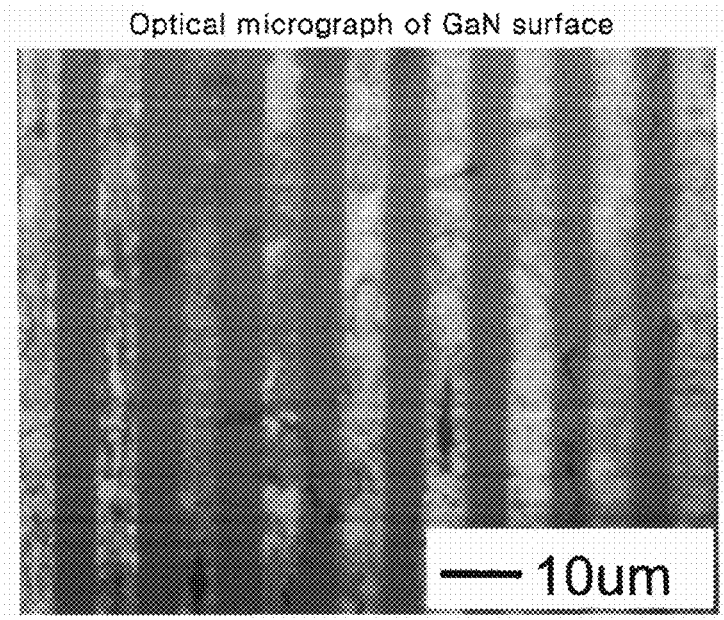
FIG. 12 is an optical micrograph of a GaN surface of the semiconductor substrate formed by the method in accordance with the first exemplary embodiment.
Figure 13:
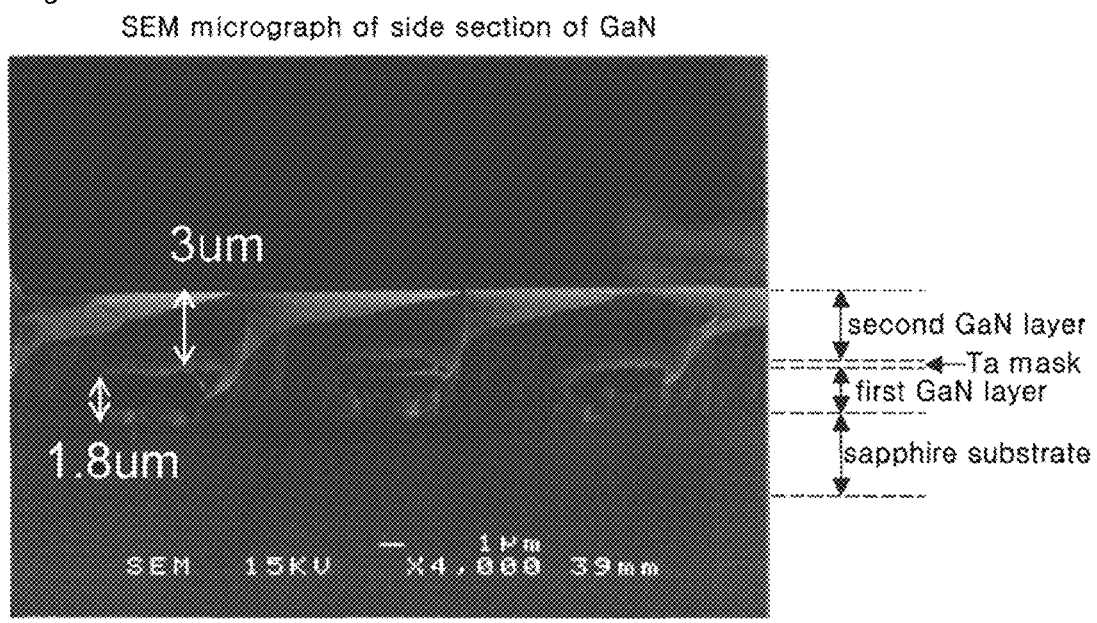
FIG. 13 is a SEM micrograph of a side section of the semiconductor substrate of FIG. 12.
Figure 14:
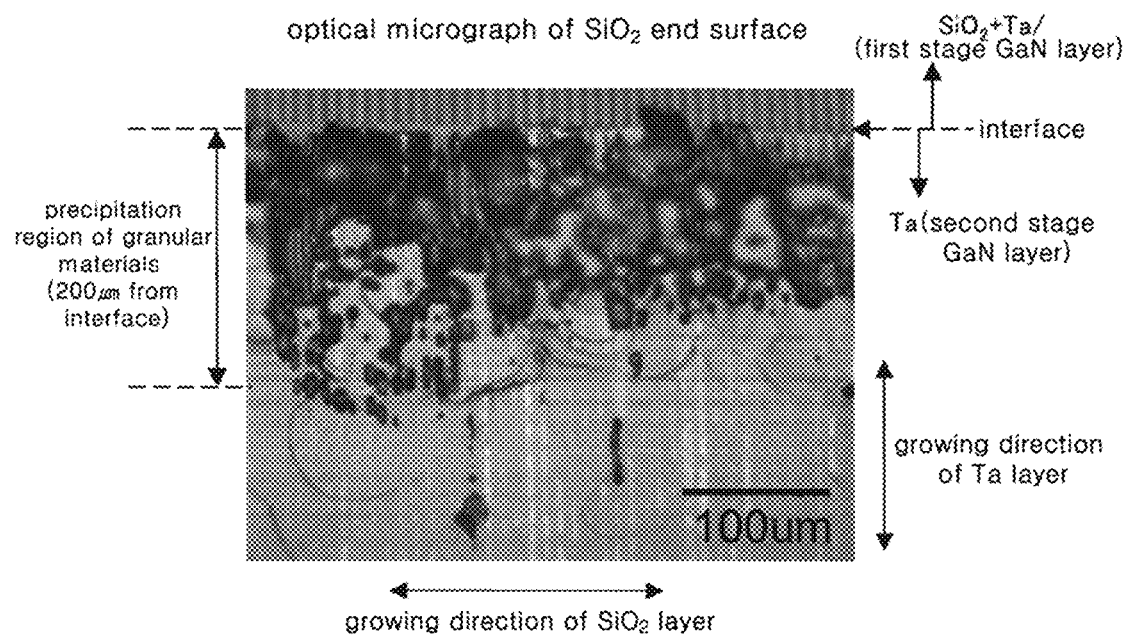
FIG. 14 is an optical micrograph of a $SiO_2$ end surface of the semiconductor substrate of FIG. 12.

FIG. 12 is an optical micrograph of a GaN surface of the semiconductor substrate 200 according to the exemplary embodiment. FIG. 13 is a SEM micrograph of a GaN section of the semiconductor substrate 200 according to the exemplary embodiment. FIG. 14 is an optical micrograph of a $SiO_2$ end surface of the semiconductor substrate 200 according to the exemplary embodiment.

In FIG. 9, the semiconductor substrate 200 according to the exemplary embodiment is characterized in that a $SiO_2$ layer 203 is formed as a mask on a partial region of the first GaN layer 202 (first semiconductor layer) surface and a stripe shape Ta layer 204 (metallic material layer) is formed in a direction intersecting the $SiO_2$ layer 203. Using the manufacturing method described below, a second GaN layer is formed on the $SiO_2$ layer 203 and the Ta layer 204. In addition, a formation direction of the Ta layer 204 depends on a crystal direction of the first GaN layer 202 and a formation location of the $SiO_2$ layer 203. When the Ta layer 204 is formed in the stripe shape, an axis of the stripes may be in a direction [1 $\bar{1}$ 0 0] of the first GaN layer 202. Further, the Ta layer 204 may be formed to intersect with the $SiO_2$ layer 203. Here, the intersection angle is not limited to a particular angle.

Next, the method of manufacturing the semiconductor substrate 200 according to the exemplary embodiment will be described with reference to FIGS. 10 and 11. In FIG. 10, (A) is a sectional view of a process of forming a first GaN layer, (B) is a sectional view of a process of forming a $SiO_2$ layer, (C) is a sectional view of a process of forming a Ta layer, and (C') is another sectional view of a process of forming a Ta layer. In FIG. 11, (A) is a sectional view of a process of forming a second GaN layer and a cavity, (B) is a sectional view of the semiconductor substrate after forming the second GaN layer, (C) is a sectional view of a process of separating a sapphire substrate from the semiconductor substrate, and (D) is a sectional view of a finished GaN substrate. FIG. 10(A), FIG. 10(B), and FIG. 10(C) are the sectional views taken along line A-B' shown in FIG. 9. FIG. 10(C') is the sectional view taken along line B-B' shown in FIG. 9. FIG. 11(A), FIG. 11(B), FIG. 11(C) and FIG. 11(D) are the sectional views taken along line B-B' shown in FIG. 9. Additionally, the respective processes shown by FIG. 10(A), FIG. 10(B) and FIG. 10(C) will be described based on the section taken along line A-B' shown in FIG. 9. Dashed dot lines in FIG. 10(A), FIG. 10(B) and FIG. 10(C) indicate an interface between a $SiO_2$+Ta stack (first stage GaN layer) region (left side of the drawings) and a Ta (second stage GaN) stack region.

In FIG. 10(A), reference numeral 201 indicates a sapphire ($Al_2O_3$) substrate. First, a first GaN layer 202 having a thickness of about 2 μm is formed on the sapphire substrate 201. Herein, it should be understood that the semiconductor substrate 200 is not limited to the sapphire substrate 201 and may be formed of other materials, such as a silicon substrate.

Next, in FIG. 10(B), a $SiO_2$ film having a thickness of about 50 nm is formed on the first GaN layer 202 by EB deposition and is processed in the shape of stripes, thereby forming a $SiO_2$ layer 203 as a mask. Here, the $SiO_2$ layer 203 is formed in the $SiO_2$+Ta stack (first stage GaN layer) region at the left side of the interface, but is not formed in the Ta stack (second stage GaN layer) region at the right side of the interface. The shape of the $SiO_2$ layer 203 is not limited to the stripe shape but may have any shape so long as the $SiO_2$ layer 203 is configured to intersect with the Ta layer 204 in a partial region on the surface of the first GaN layer 202. In addition, the thickness of the $SiO_2$ layer is not limited to 50 nm, but may be adjusted, for example, in the range of 10~200 nm. Further, the mask provided as an insulation layer is not limited to the $SiO_2$ layer, but may include SiN, SiON, and the like. Alternatively, Pt, Mo, and the like may be used for the mask. In other words, the mask may be formed of any material that does not dissolve the first GaN layer 202 and is not etched during formation of a second GaN layer 205 described below.

Then, a Ta layer (metallic material layer) 204 having a thickness of about 50 nm is formed in a stripe shape, each of which have a width of 5 μm and are separated by a distance of 10 μm from each other, on the first GaN layer 102 and the $SiO_2$ layer 203 by EB deposition and lift-off. When the Ta layer 204 is formed in the stripe shape, an axis of the stripes is in a direction [1 $\bar{1}$ 0 0] of the first GaN layer 202. The configuration of the semiconductor substrate 200 shown in FIG. 9 is formed using the process described above. Here, the Ta layer 204 is formed on the $SiO_2$ layer 203 in the $SiO_2$+Ta stack (first stage GaN layer) region at the left side of the interface, and is formed on the first GaN layer 202 in the Ta stack (second stage GaN layer) region at the right side of the interface. Another cross-section of the Ta layer 204 is shown in FIG. 10(C'). FIG. 11(A), FIG. 11(B), FIG. 11(C), and FIG. 11(D) shows processes continuing from FIG. 10(C').

Referring to FIG. 11(A), a second GaN layer 205 is formed on the first GaN layer 202 and Ta layer 204 by MOCVD. FIG. 11(A) shows the second GaN layer 205 during formation thereof. Crystal growth of the second GaN layer 205 is performed at a heating temperature of 1045° C. for 5 hours while supplying TMG as a raw gas at a flux of 87 μmol/min. Further, N in the first GaN layer 202 combines with Ta to form TaN, which acts as foreign matter and rises towards a vapor phase region having a higher density of N. The TaN becomes unstable at 900° C., and a hole 204a is deepened to form a cavity 202a depending on the degree of instability. N in the first GaN layer 202 becomes TaN, and Ga remains in the first GaN layer 202. Since the Ga remaining in the first GaN layer 202 is the same as Ga deposited during the vapor deposition, it may be used as a raw material. In addition, the second GaN layer 205 is not formed on the $SiO_2$ layer 203 having a width of 500 μm. However, it should be noted that the second GaN layer 205 may be grown on the $SiO_2$ layer 203 depending on the pressure (for example, 500 Torr) inside the MOCVD apparatus during the formation of the second GaN layer 205, and the width of the $SiO_2$ layer 203 (for example, 1 mm or more).

Next, referring to FIG. 11(B), as the formation of the second GaN layer 205 is completed, the semiconductor substrate 200 is prepared. While the second GaN layer 205 is formed by MOCVD, a portion of the first GaN layer 202 under the Ta layer 204 is removed by etching and a formation region of the cavity 202a is extended substantially to the sapphire substrate 201. A hole (not shown) near the interface between the Ta layer 204 and the $SiO_2$ layer 203 is opened upwardly (toward the second GaN layer 205) together with the growth of the second GaN layer 205, TaN may evaporate through the hole, thereby allowing a layer containing no granular material to be formed on the surface of the substrate, as shown in FIG. 11(B).

Next, referring to FIG. 11(C), the sapphire substrate 201 is separated. Then, referring to FIG. 11(D), the GaN substrate may be obtained by polishing the first GaN layer 202, from which the sapphire substrate 201 is removed. The GaN substrate may be used as a semiconductor substrate for manufacturing a device by attaching a silicon-based substrate such as Si or SiC to an upper side of the GaN substrate 200 and flattening a lower surface thereof. Separation of the sapphire substrate 201 may be performed by, for example, a laser lift-off or polishing process. It should be understood that the method of separating the sapphire substrate 201 is not limited to a specific one in this exemplary embodiment.

Figure 15:
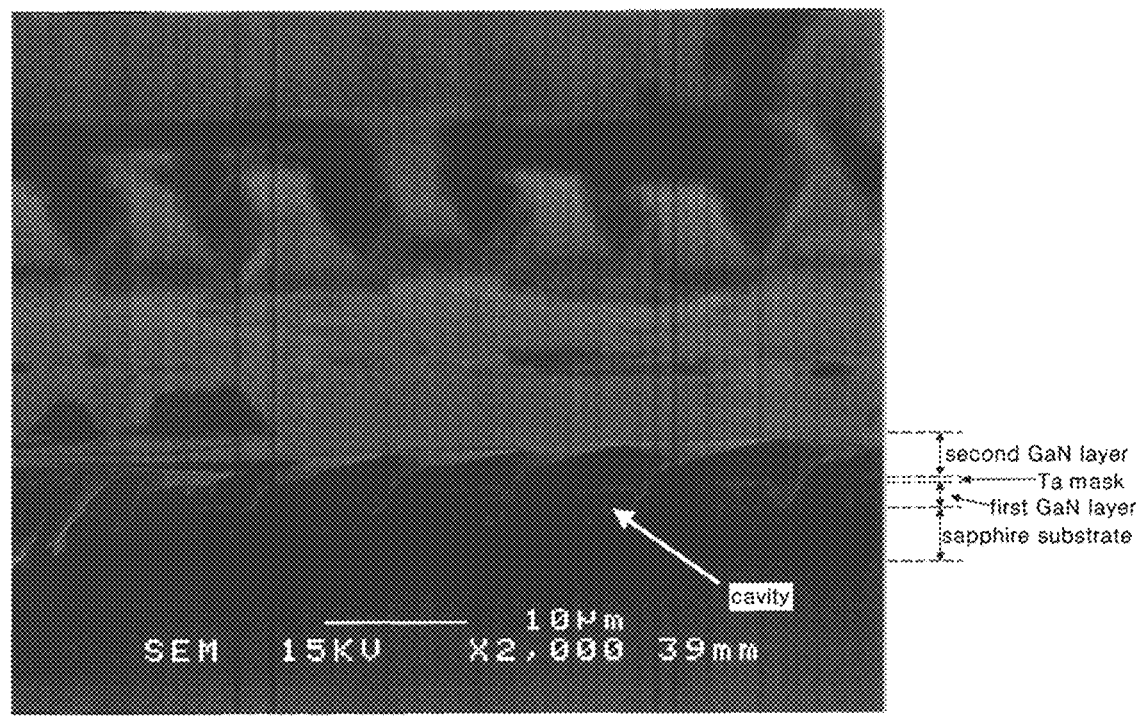
FIG. 15 is a SEM micrograph of a side section and surface of the semiconductor substrate of FIG. 12.
Figure 16:
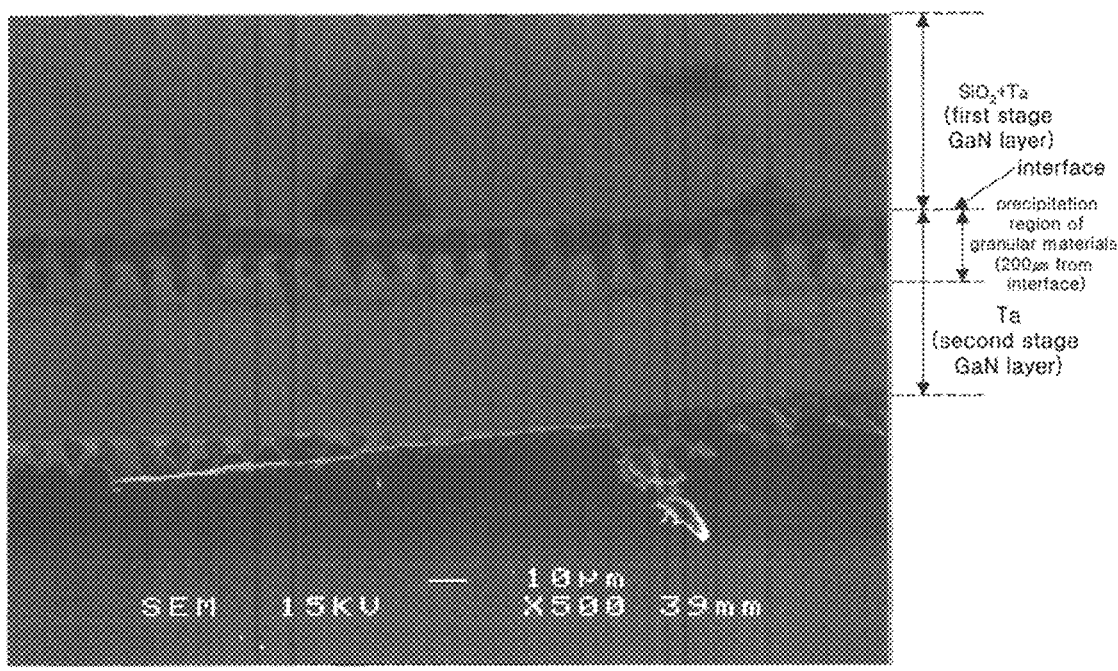
FIG. 16 is a SEM micrograph of a side section and surface near the $SiO_2$ end of the semiconductor substrate of FIG. 12.

Next, the semiconductor substrate 200 manufactured by the method described above will be described with reference to FIGS. 12 to 16. FIG. 12 is an optical micrograph of a GaN surface after forming the second GaN layer 205. FIG. 13 is a SEM micrograph of a side section of the semiconductor substrate 200 shown in FIG. 12. FIG. 14 is an optical micrograph of a surface of the semiconductor substrate 200 near an interface between the $SiO_2$ layer 203+Ta layer 204 and the Ta layer 204. FIG. 15 is a SEM micrograph of a side section and surface of the semiconductor substrate 200. FIG. 16 is a SEM micrograph of a side section and surface of the semiconductor substrate 200 near an interface between the $SiO_2$ layer 203+Ta layer 204 and the Ta layer 204. Further, the manufacturing conditions of the semiconductor substrate 200 shown in FIGS. 12 to 16 are the same as those used to manufacture the semiconductor substrate 200 shown in FIG. 11.

In the optical micrograph of FIG. 12, both the surface of the semiconductor substrate 200 and the Ta layer 204 are shown. In the optical micrograph of the GaN surface after forming the second GaN layer 205 as shown in FIG. 12, no granular material appears on the surface of the second GaN layer 205. In the SEM micrograph of the side section of the semiconductor substrate 200 shown in FIG. 13, a cavity 202a is formed in a portion of the first GaN layer 202 under the Ta layer 204 and no granular material appears on the surface of the second GaN layer 205.

In the optical micrograph of an end surface of the $SiO_2$ layer 203 shown in FIG. 14, a region above a dotted line is the $SiO_2$+Ta stack (first stage GaN layer) region, that is, a region where the $SiO_2$ layer 203 and the Ta layer 204 are stacked on the first GaN layer 202, and a region under the dotted line is the Ta stack (second stage GaN layer) region, that is, a region where the Ta layer 204 and the second GaN layer 205 are stacked on the first GaN layer 202. In FIG. 14, precipitation of granular materials can be observed on the surface of the second GaN layer 205 on the Ta layer 204 (second stage GaN layer) under the interface between the $SiO_2$+Ta stack (first stage GaN layer) region and the Ta stack (second stage GaN layer) region. Here, as shown in FIG. 14, the precipitation region of the granular materials is limited to a distance of about 200 μm away from the interface indicated by the dotted line on the Ta (second stage GaN layer) region under the interface. Further, precipitation of the granular materials is not observed in the $SiO_2$+Ta (first stage GaN layer) region. It was ascertained that fine holes were formed in the second GaN layer 205 grown on the Ta layer 204 under the interface to allow precipitation of Ga granules therein.

The thickness of the second GaN layer 205 was measured. The second GaN layer 205 located at a distance of about 200 μm away from the interface in the Ta stack (second stage GaN layer) had a thickness of about 3 μm, as shown in FIG. 13, but the second GaN layer 205 located on the interface between the $SiO_2$+Ta stack (first stage GaN layer) region and the Ta stack (second stage GaN layer) region had a thickness of about 10 μm. It was ascertained that the growth rate of the second GaN layer 205 on the interface of the $SiO_2$+Ta stack (first stage GaN layer) region is higher than that of the second GaN layer 205 located at a distance of about 200 μm away from the interface, thereby allowing the precipitation of Ga granules.

Accordingly, in the semiconductor substrate 200 shown in FIGS. 13 and 14, the region having the remaining second GaN layer 205 thereon may be used as the GaN layer by removing the precipitation region of the granular materials within a distance of about 200 μm from the interface. Further, referring to the SEM micrograph of the side section and surface of the semiconductor substrate 200 shown in FIG. 15, it was ascertained that a cavity 202a was formed in the first GaN layer 202 by etching.

As such, for the semiconductor substrate 200 of the present exemplary embodiment embodiment, the conditions for forming the second GaN layer 205 using the MOCVD apparatus were adjusted, thereby enabling the cavity 202a to be formed in the first GaN layer 202 using the Ta layer 204 by etching. Thus, when the second GaN layer 205 is formed according to the present exemplary embodiment, it is possible to form the cavity 202a in the first GaN layer 202 by etching during growth of the first GaN layer 202. In other words, when a metallic material layer is partially formed on the first GaN layer 202 to cause an etching phenomenon as described above, it is possible to form the cavity 202a in the first GaN layer 202.

Further, the MOCVD conditions for the present exemplary embodiment are provided as an example, and thus, any condition may be used so long as the condition allows the growth of the first GaN layer 202 and the formation of the cavity 202a to progress simultaneously.

Further, for the semiconductor substrate 200 according to the present exemplary embodiment, the SiO$_2$ layer 203 is formed as a mask in a partial region on the surface of the first GaN layer 202 and the Ta layer 204 is formed in a stripe shape to intersect with the SiO$_2$ layer 203. By using a partial stack structure of the SiO$_2$ layer 203 and the Ta layer 204, a precipitation region of granular materials on the surface of the second GaN layer 205 is limited to the partial region on the surface of the second GaN layer 205 on the Ta layer 204 near the interface between the SiO$_2$ layer 203 and the Ta layer 204 (that is, a precipitation region is limited to a distance of about 200 μm from the interface shown in FIG. 14). Thereby the granular material may be prevented from being precipitated in a region other than this precipitation region. Accordingly, the remaining substrate may be used as the GaN substrate merely by removing the granular material precipitation region from the semiconductor substrate 200.

Further, the shape of the Ta layer 204 is not limited to the aforementioned stripe shape and may be modified depending on a device structure to be formed on the semiconductor substrate 200. An example of a device formed using the semiconductor substrate 200 will be described below.

The semiconductor substrate 200 according to the present exemplary embodiment may be reused as a substrate 201 for forming a GaN layer having the aforementioned cavity. The GaN substrate may be separated and then the surface of the sapphire substrate 201 may be flattened by reactive ion etching (RIE) or the like. Hence, manufacturing costs of the GaN substrate can be further reduced.

In the present exemplary embodiment, the semiconductor substrate 200 is shown as including the Ta layer 204 formed in a stripe shape intersecting the SiO$_2$ layer 203. However, the shape of the Ta layer 204 is not limited thereto, and may be varied depending on the structure of a device to be formed on the semiconductor substrate 200. For example, in a semiconductor substrate 300 shown in FIG. 17(A), a Ta layer 303 having a stripe shape may be formed to intersect two SiO$_2$ layers 302, which are formed in a stripe shape near opposite sides of a circular sapphire substrate 301. When a second GaN layer (not shown) is formed on the semiconductor substrate 300 using the MOCVD apparatus, a granular material precipitation region is limited as shown in FIG. 14. In other words, the granular material precipitation region is limited to a is distance of about 200 μm from the interface between the SiO$_2$ layer 302 and the Ta layer 303 to the Ta layer 303. Accordingly, a region A in FIG. 17(A) may be used as the GaN substrate after the granular material precipitation region is removed.

Figure 17:
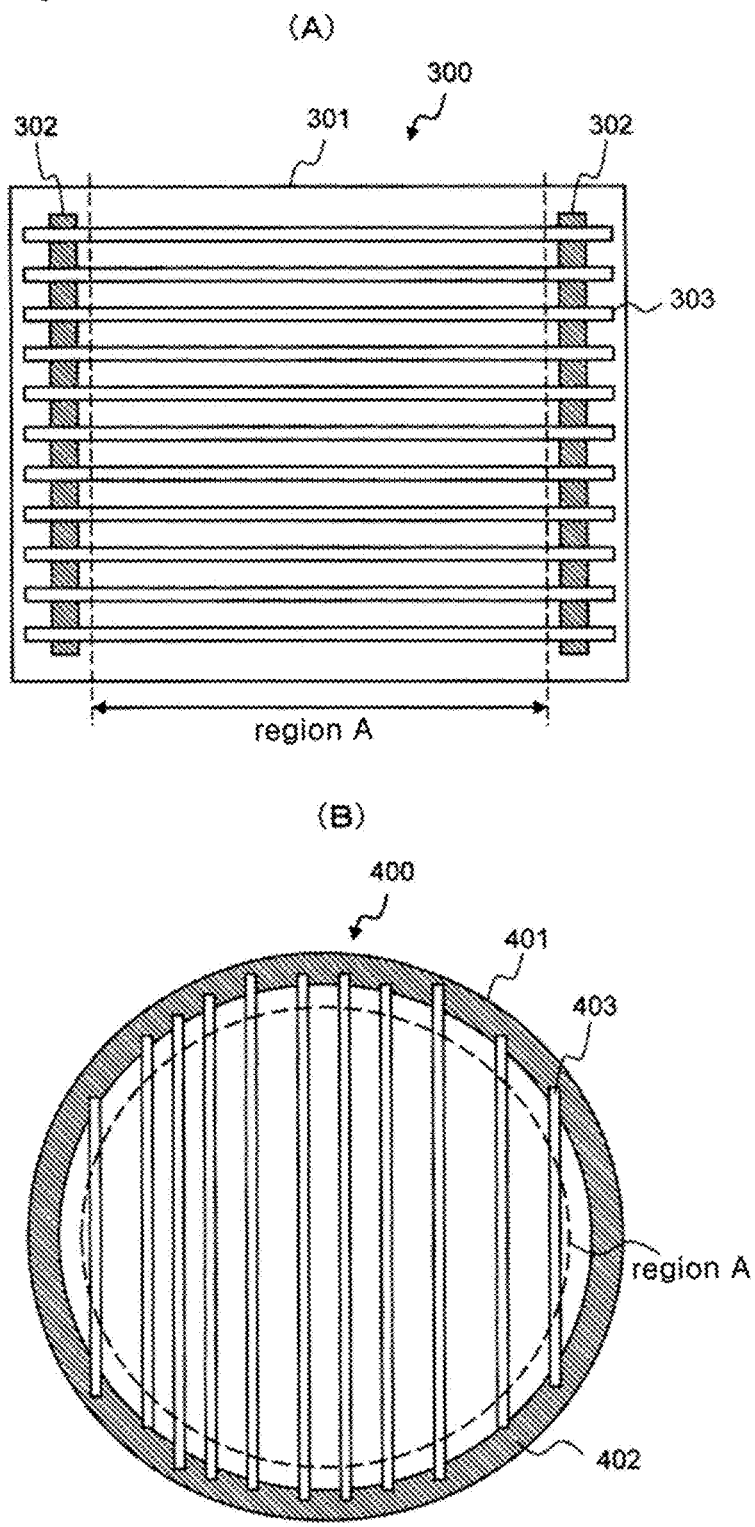
FIG. 17 shows another example of the semiconductor substrate in accordance with the first exemplary embodiment, in which (A) is a plan view of the semiconductor substrate having a $SiO_2$ layer and a Ta layer on a spherical sapphire substrate, and (B) is a plan view of the semiconductor substrate having a $SiO_2$ layer and a Ta layer on a circular sapphire substrate.

In a semiconductor substrate 400 shown in FIG. 17(B), a Ta layer 403 having a stripe shape may be formed to intersect with a circular SiO$_2$ layer 402 along a rim of a circular sapphire substrate 401 having a first GaN layer (not shown) disposed thereon. When a second GaN layer (not shown) is further formed on the semiconductor substrate 400 using the MOCVD apparatus, a granular material precipitation region is limited as shown in FIG. 14. In other words, the granular material precipitation region is limited to a distance of about 200 μm inside the Ta layer 403 from the interface between the SiO$_2$ layer 402 and the Ta layer 403. Accordingly, a region A in FIG. 17(B) may be used as the GaN substrate after the granular material precipitation region is removed.

A light emitting diode (LED) array formed on the semiconductor substrate 200 will be described with reference to FIG. 18.

Figure 18:
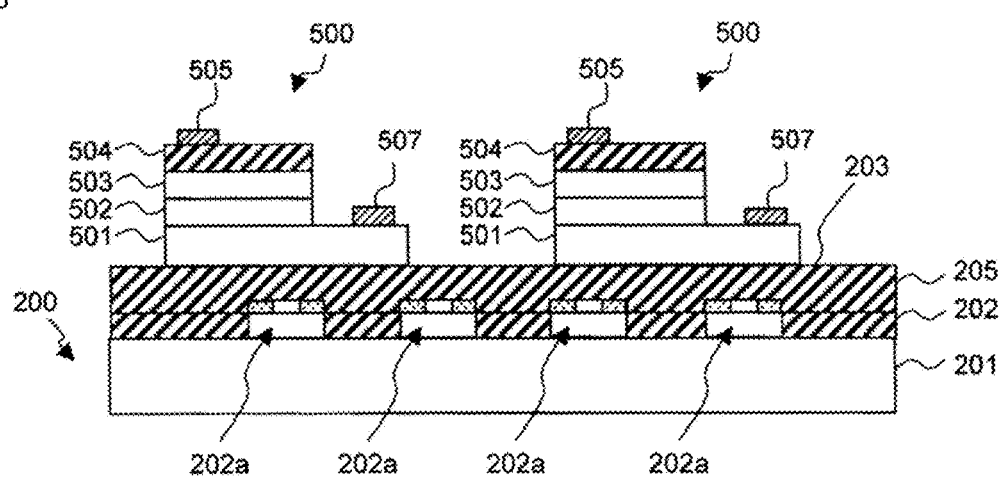
FIG. 18 is a sectional view of an LED array in accordance with a second exemplary embodiment.

FIG. 18 is a cross-sectional view of an LED array in accordance with an exemplary embodiment of the present invention. In FIG. 18, the semiconductor substrate 200 is used.

Referring to FIG. 18, LEDs 500 are separated from each other on the semiconductor substrate 200. Each LED 500 includes a lower semiconductor layer 501 composed of a first conductive type semiconductor layer, an active layer 502, and an upper semiconductor layer 503 composed of a second conductive type semiconductor layer. The active layer 502 may have a single or multi-quantum well structure having a barrier layer, and may be formed of a material and composition selected depending on a desired light emitting field. For example, the active layer 502 may be formed of a gallium nitride-based compound semiconductor. The lower and upper semiconductor layers 501, 503 may be a gallium nitride-based compound semiconductor having a band gap greater than that of the active layer 502.

In the present exemplary embodiment, the lower semiconductor layer 501 formed on the semiconductor substrate 200 may be formed on the second GaN layer 205. Thus, it is possible to reduce manufacturing costs by manufacturing the LEDs 500 using the semiconductor substrate 200.

The upper semiconductor layer 503 is located above a portion of the lower semiconductor layer 501, and the active layer 502 is interposed between the upper semiconductor layer 503 and the lower semiconductor layer 501. Further, an upper electrode layer 504 may be formed on the upper semiconductor layer 503. The upper electrode layer 504 may be a transparent electrode layer formed of, for example, indium tin oxide (ITO), Ni/Au, and the like.

Further, an upper electrode pad 505 is formed on the upper electrode layer 504 and a lower electrode pad 507 is formed on an exposed region of the lower semiconductor layer 501.

After the LEDs 500 are formed on the single semiconductor substrate 200 in this manner, the LEDs 500 are divided into individual LEDs 500 by cutting a portion of the semiconductor substrate 200 between the LEDs 500. In the LED according to the present exemplary embodiment, the upper electrode 505 and the lower electrode pad 507 are laterally arranged, but an LED may be manufactured to have vertically arranged electrodes. In other words, a vertical type LED may be manufactured by separating the sapphire substrate 201 using the cavity 202a of the semiconductor substrate 200, flattening the separated surface of the first GaN layer 202 by RIE or the like, and forming upper and lower electrode pads 505, 507.

It is possible to reduce manufacturing costs of the LEDs 500 by manufacturing the LEDs 500 using the semiconductor substrate 200. Further, when forming the LEDs 500 on the second GaN layer 205, it is possible to construct an LED array with improved light emitting efficiency and high brightness by forming the compound semiconductors such that the second GaN layer 205 and the lower semiconductor layer 501 have different indices of refraction from each other. Further, when a laser diode is formed using the GaN substrate 200, from which the sapphire substrate 201 is separated, it is possible to achieve an improvement in heat dissipation properties together with long operational lifetime of the laser diode, since the laser diode is formed on the GaN layer 205, which exhibits better thermal conductivity than the sapphire substrate 201.

In the present exemplary embodiment, the LEDs 500 are formed on the second GaN layer 205 of the semiconductor substrate 200. Alternatively, the LEDs 500 may be formed in the same manner on the GaN substrate which is separated from the sapphire substrate 201. In addition, a semiconductor device, such as a filed effect transistor (FET) and the like, may be formed by attaching a silicon-based substrate, such as Si or SiC, as an indication material, to a surface of the GaN substrate which has been separated from the sapphire substrate 201, and polishing the separated surface of the GaN substrate by RIE or the like. In this case, a high-current device can be manufactured.

Therefore, the semiconductor substrate 200 may be used to manufacture semiconductor devices such as LEDs or laser diodes, thereby facilitating manufacture of high performance semiconductor devices at low cost without using an expensive GaN substrate.

Further, in the present exemplary embodiment, the Ta layer is formed as the metallic material layer, but a Ti layer or Cr layer may also be formed. Further, any metal alloy, alloys of metals and semiconductors, or any metallic material capable of permitting an etching phenomenon in the first GaN layer may also be used.

According to the present invention, a method of manufacturing a flat and easily separable GaN substrate on a heterogeneous substrate at low cost is disclosed. Performance improvement and long operational lifespan of semiconductor devices, such as LEDs or laser diodes, which are manufactured using the GaN substrate may also be realized according to the present invention.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A semiconductor substrate, comprising:
a substrate;
a first semiconductor layer arranged on the substrate;
a metallic material layer arranged on the first semiconductor layer;
a second semiconductor layer arranged on the first semiconductor layer and the metallic material layer; and
a plurality of cavities in the first semiconductor layer and arranged under the metallic material layer,
wherein the metallic material layer comprises a plurality of stripe-shaped patterns arranged at a constant interval, and
wherein each cavity of the plurality of cavities is arranged under and overlapped with each stripe-shaped pattern of the plurality of stripe-shaped patterns, respectively.

2. The semiconductor substrate of claim 1, further comprising a mask arranged on a first region of the first semiconductor layer,
wherein the metallic material layer is arranged on the mask in a direction intersecting the mask, and
wherein the first region of the first semiconductor layer comprises a portion of a peripheral region on the first semiconductor layer.

3. The semiconductor substrate of claim 1, wherein each stripe-shaped pattern has a constant width.

4. The semiconductor substrate of claim 1, wherein the substrate comprises sapphire or silicon.

5. A method of manufacturing a semiconductor substrate, the method comprising:
forming a first semiconductor layer on a substrate;
forming a mask on a first region of the first semiconductor layer;
forming a metallic material layer on the first semiconductor layer and the mask, the metallic material layer being formed in a direction intersecting the mask; and
forming a second semiconductor layer on the first semiconductor layer and the metallic material layer, wherein a plurality of cavities is formed in the first semiconductor layer and arranged under the metallic material layer,
wherein the metallic material layer comprises a plurality of stripe-shaped patterns arranged at a constant interval, and
wherein each cavity of the plurality of cavities is arranged under and overlapped with each stripe-shaped pattern of the plurality of stripe-shaped patterns, respectively.

6. The method of claim 5, wherein the first region comprises a portion of a peripheral region on the first semiconductor layer.

7. The method of claim 6, wherein each stripe-shaped pattern has a constant width.

8. The method of claim 5, wherein the substrate comprises sapphire or silicon.

9. A semiconductor device, comprising:
a semiconductor substrate, comprising:
a first semiconductor layer arranged on a substrate;
a metallic material layer arranged on the first semiconductor layer;
a second semiconductor layer arranged on the first semiconductor layer and the metallic material layer; and
a plurality of cavities in the first semiconductor layer and arranged under the metallic material layer,
wherein the first region comprises a portion of a peripheral region on the first semiconductor layer,
wherein the metallic material layer comprises a plurality of stripe-shaped patterns arranged at a constant interval, and each stripe-shaped pattern has a constant width,
a first conductive type semiconductor layer arranged on the second semiconductor layer;
an active layer arranged on the first conductive type semiconductor layer; and
a second conductive type semiconductor layer arranged on the active layer,
wherein each cavity of the plurality of cavities is arranged under and overlapped with each stripe-shaped pattern of the plurality of stripe-shaped patterns, respectively.

10. A method of manufacturing a semiconductor device, the method comprising:
forming a semiconductor substrate, comprising:
forming a first semiconductor layer on a substrate;
forming a mask on a first region of the first semiconductor layer;
forming a metallic material layer on the first semiconductor layer and the mask, the metallic material layer being formed in a direction intersecting the mask; and
forming a second semiconductor layer on the first semiconductor layer and the metallic material layer,
wherein a plurality of cavities is formed in the first semiconductor layer and arranged under the metallic material layer,
the first region comprises a portion of a peripheral region on the first semiconductor layer, and
wherein the metallic material layer comprises a plurality of stripe-shaped patterns formed at a constant interval, and each stripe-shaped pattern has a constant width;
forming a first conductive type semiconductor layer on the second semiconductor layer;
forming an active layer on the first conductive type semiconductor layer; and
forming a second conductive type semiconductor layer on the active layer,
wherein each cavity of the plurality of cavities is arranged under and overlapped with each stripe-shaped pattern of the plurality of stripe-shaped patterns, respectively.

11. The method of claim 5, further comprising forming the second semiconductor layer on the mask.

12. The method of claim 5, further comprising a hole formed within 200 μm of where the metallic material layer and the mask intersect, wherein a metal from the metallic material layer evaporates through the hole.

13. The method of claim 5, wherein a granular material comprising a metal from the metallic material layer is formed within 200 μm of where the metallic material layer and the mask intersect.

14. The method of claim 5, further comprising separating a first portion of the substrate on which the mask is formed from a second portion of the substrate on which the mask is not formed.

15. The method of claim 5, further comprising separating the substrate from the first semiconductor layer.

16. The semiconductor substrate of claim 2, further comprising a second mask arranged on a second region of the first semiconductor layer, wherein the metallic material layer is arranged on the second mask, the metallic material layer being arranged in a direction intersecting the second mask.

17. The semiconductor substrate of claim 16, wherein the second region comprises a portion of a peripheral region on the first semiconductor layer.

18. The method of claim 13, wherein the granular material comprises a granular mixture of Ga and Ta.

19. The semiconductor substrate of claim 2, further comprising a granular material comprising a metal from the metallic material layer formed within 200 μm of where the metallic material layer and the mask intersect.

20. The semiconductor substrate of claim 19, wherein the granular material comprises a granular mixture of Ga and Ta.

* * * * *